(12) United States Patent
Harada et al.

(10) Patent No.: US 10,825,977 B2
(45) Date of Patent: Nov. 3, 2020

(54) METHOD OF MANUFACTURING THERMOELECTRIC CONVERTER

(71) Applicants: DENSO CORPORATION, Kariya (JP); TOYOTA JIDOSHA KABUSHIKI KAISHA, Toyota (JP)

(72) Inventors: Toshikazu Harada, Kariya (JP); Atusi Sakaida, Kariya (JP); Toshihisa Taniguchi, Kariya (JP); Tomohiro Imura, Kariya (JP); Yuki Sakashita, Kariya (JP); Hayato Watanabe, Kariya (JP)

(73) Assignees: DENSO CORPORATION, Kariya (JP); TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/339,389

(22) PCT Filed: Aug. 29, 2017

(86) PCT No.: PCT/JP2017/030924
§ 371 (c)(1),
(2) Date: Apr. 4, 2019

(87) PCT Pub. No.: WO2018/066271
PCT Pub. Date: Apr. 12, 2018

(65) Prior Publication Data
US 2020/0044135 A1 Feb. 6, 2020

(30) Foreign Application Priority Data
Oct. 7, 2016 (JP) .................... 2016-199297

(51) Int. Cl.
*H01L 35/34* (2006.01)
*H01L 35/32* (2006.01)

(52) U.S. Cl.
CPC .............. *H01L 35/34* (2013.01); *H01L 35/32* (2013.01)

(58) Field of Classification Search
CPC ......... H01L 35/32; H01L 35/34; H01L 35/22; H01L 35/30; H01L 35/08; H01L 35/10
See application file for complete search history.

(56) References Cited

U.S. PATENT DOCUMENTS 8,378,206 B2 * 2/2013 Schuette ................ H01L 35/32
136/205
9,680,079 B2 * 6/2017 Taniguchi ............... H01L 23/38
(Continued)

FOREIGN PATENT DOCUMENTS

| JP | 2009049165 A | 3/2009 |
|---|---|---|
| JP | 2014007376 A | 1/2014 |

*Primary Examiner* — Nikolay K Yushin
(74) *Attorney, Agent, or Firm* — Harness, Dickey & Pierce, P.L.C.

(57) ABSTRACT

A method of manufacturing a thermoelectric converter includes filling each of a plurality of through-holes in each of a plurality of resin films with fillers containing a plurality of thermoelectric material particles. At this time, a part of the filler is extruded from each through-hole. In this state, the plurality of resin films are stacked together. A top-surface protection member having top-surface conductor patterns is stacked on one side of the plurality of resin films. A back-surface protection member having back-surface conductor patterns is stacked on the other side of the plurality of resin films. Thus, an integrated stacked body is formed. The integrated stacked body is then heated and pressurized. A plurality of thermoelectric material particles are thereby sintered to form the first and second thermoelectric members.

2 Claims, 14 Drawing Sheets

(56) References Cited

U.S. PATENT DOCUMENTS

| | | | | |
|---|---|---|---|---|
| 2008/0121263 A1* | 5/2008 | Schutte | ............... | H01L 35/32 |
| | | | | 136/203 |
| 2013/0218241 A1* | 8/2013 | Savoy | ............... | A61F 7/007 |
| | | | | 607/98 |
| 2015/0144171 A1* | 5/2015 | Taniguchi | ............... | H01L 23/38 |
| | | | | 136/205 |

* cited by examiner

METHOD OF MANUFACTURING THERMOELECTRIC CONVERTER

CROSS REFERENCE TO RELATED APPLICATIONS

This application is a U.S. National Phase Application under 35 U.S.C. 371 of International Application No. PCT/JP2017/030924 filed on Aug. 29, 2017. This application is based on and claims the benefit of priority from Japanese Patent Application No. 2016-199297 filed on Oct. 7, 2016. The entire disclosures of all of the above applications are incorporated herein by reference.

TECHNICAL FIELD

The present disclosure relates to a method of manufacturing a thermoelectric converter.

BACKGROUND ART

Patent Literature 1 discloses a conventional manufacturing method of a thermoelectric converter. The manufacturing method of Patent Literature 1 forms a plurality of through-holes to one insulating film. Each of the plurality of through-holes is then filled with a filler. The filler includes a plurality of paste-like thermoelectric material particles. Next, a top-surface protection member having top-surface conductor patterns, one insulating film filled with the fillers, and a back-surface protect member having back-surface conductor patterns are stacked to form an integrated stacked body. Then, this integrated stacked body is heated and pressurized and thus integrated overall. At this time, the plurality of thermoelectric material particles are sintered to form a plurality of thermoelectric members formed of sintered bodies. Each top-surface conductor pattern and each back-surface conductor pattern are connected to each of the plurality of thermoelectric members.

PRIOR ART LITERATURE

Patent Literature

Patent Literature 1: JP 2014-7376 A

SUMMARY OF INVENTION

The present inventors have found that the following point arises about the above conventional manufacturing method.

When filling the through-holes with the fillers, voids (namely, small gaps) may mix into the fillers filling the through-holes. Mixture of voids causes shortage of the amount of the fillers by the volume of the voids. When the integrated stacked body mixed with voids is heated and pressurized, the fillers are not sufficiently pressurized. As a result, the thermoelectric material particles are not sufficiently sintered.

This causes gaps inside the thermoelectric members or between the thermoelectric members and conductor patterns. Therefore, the connection reliability between the top-surface conductor patterns and the back-surface conductor patterns through the thermoelectric members is thus reduced.

The reduction in the connection reliability is more remarkable as one insulating film is thicker. The insulating film becomes thicker, the aspect ratio of the through-hole become higher. Voids are more likely to mix as the aspect ratio is higher. The aspect ratio is the ratio of the depth of a through-hole to the opening width of the through-hole. In two through-holes having the same opening width, one having a larger depth has a higher aspect ratio. When the aspect ratio becomes high, voids are likely to generate toward the bottom of the through-hole in particular.

Also, when sintering a plurality of thermoelectric material particles with no void mixing into the fillers filling the through-holes, the total apparent volume of the fillers are reduced. This produces gaps between the thermoelectric members and conductor patterns. As a result, the connection reliability between the thermoelectric members and the conductor patterns is thus reduced.

An object of the present disclosure is to provide a method of manufacturing a thermoelectric converter to improve the connection reliability between the top-surface conductor patterns and back-surface conductor patterns.

According to an aspect of the present disclosure, a method of manufacturing a thermoelectric converter includes: preparing a plurality of insulating films each having a plurality of through-holes; filling each of the through-holes in each of the plurality of insulating films with a filler containing a plurality of thermoelectric material particles; stacking the plurality of insulating films together after the filling with the filler, stacking a first conductor film to one side of all the plurality of insulating films in the stacking direction, and stacking a second conductor film to the other side of all the plurality of insulating films in the stacking direction to thereby form an integrated stacked body; and heating and pressurizing the integrated stacked body in the stacking direction of the integrated stacked body to sinter the plurality of thermoelectric material particles together, forming thermoelectric members each having a continuous shape from the first conductor film to the second conductor film, and connecting the thermoelectric members to both the first conductor films and the second conductor films. In the filling, a part of the filler is extruded from each of the plurality of through-holes, and the other part of the filler is disposed inside each through-hole. In forming the integrated stacked body, the plurality of insulating films are stacked together in a state where the part of the filler is extruded.

As the first conductor film, a conductor film patterned with a top-surface conductor pattern or a conductor film before patterned with the top-surface conductor pattern can be used. As the second conductor film, a conductor film patterned with a back-surface conductor pattern or a conductor film before patterned with the back-surface conductor pattern can be used.

The above manufacturing method forms an insulating member by using the plurality of insulating films. The thickness of each insulating film can be therefore made smaller as compared to forming an insulating member having the same thickness as above by using a single insulating film. The aspect ratio of each through-hole can be thus made small in one insulating film. Voids mixing into the filler filling each through-hole can be reduced.

The plurality of insulating films are stacked together in a state where a part of the filler is extruded from each through-hole. The fillers can be heated and pressurized in a state where the filling amount of the fillers is larger than the volume of the through-holes.

As such, when voids mix into the fillers filling the through-holes, it is less likely that the filling amount of the fillers will be insufficient. The fillers can be sufficiently pressurized when the integrated stacked body is heated and pressurized. Thus, a plurality of thermoelectric material particles can be sufficiently sintered. It is less likely that gaps will be generated inside each thermoelectric member or between the thermoelectric members and the top-surface conductor patterns or back-surface conductor patterns. Also, when no void mixes into the fillers filling the through-holes, it is less likely that gaps will be generated between the thermoelectric members and conductor patterns.

This can improve the connection reliability between the top-surface conductor patterns and back-surface conductor patterns.

BRIEF DESCRIPTION OF DRAWINGS

The above object, other objects, features, and advantages of the present disclosure will be more fully apparent from the following detailed description in reference to the accompanying drawings, in which.

DESCRIPTION OF EMBODIMENTS

Embodiments of the present disclosure are described below based on the drawings. The same or equivalent parts are labeled with the same reference signs among the following embodiments.

First Embodiment

A heat flux sensor as a thermoelectric converter and a method of manufacturing the sensor according to the present embodiment will be explained.

Figure 1:
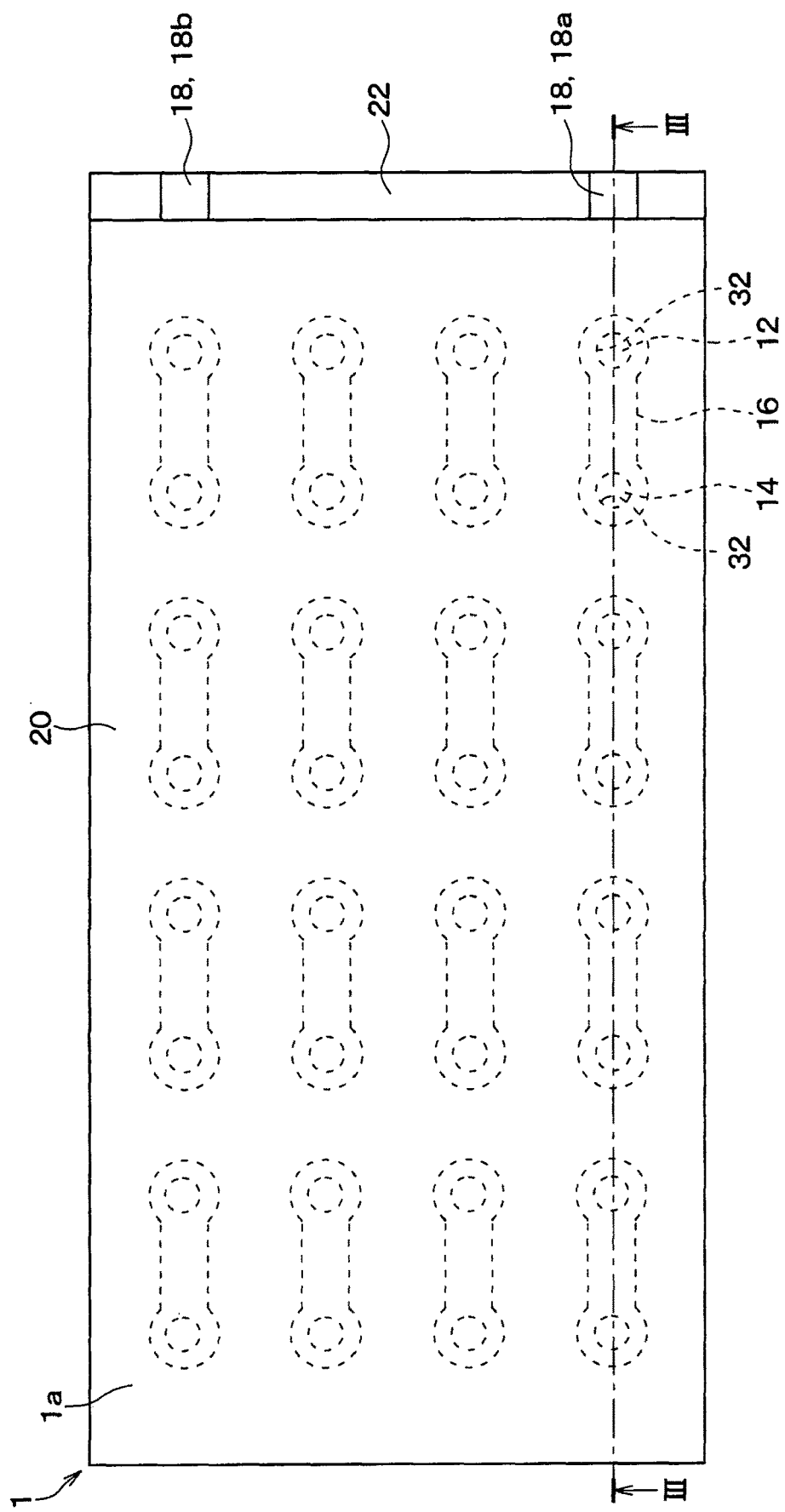
FIG. 1 is a top-surface of a heat flux sensor according to a first embodiment.
Figure 2:
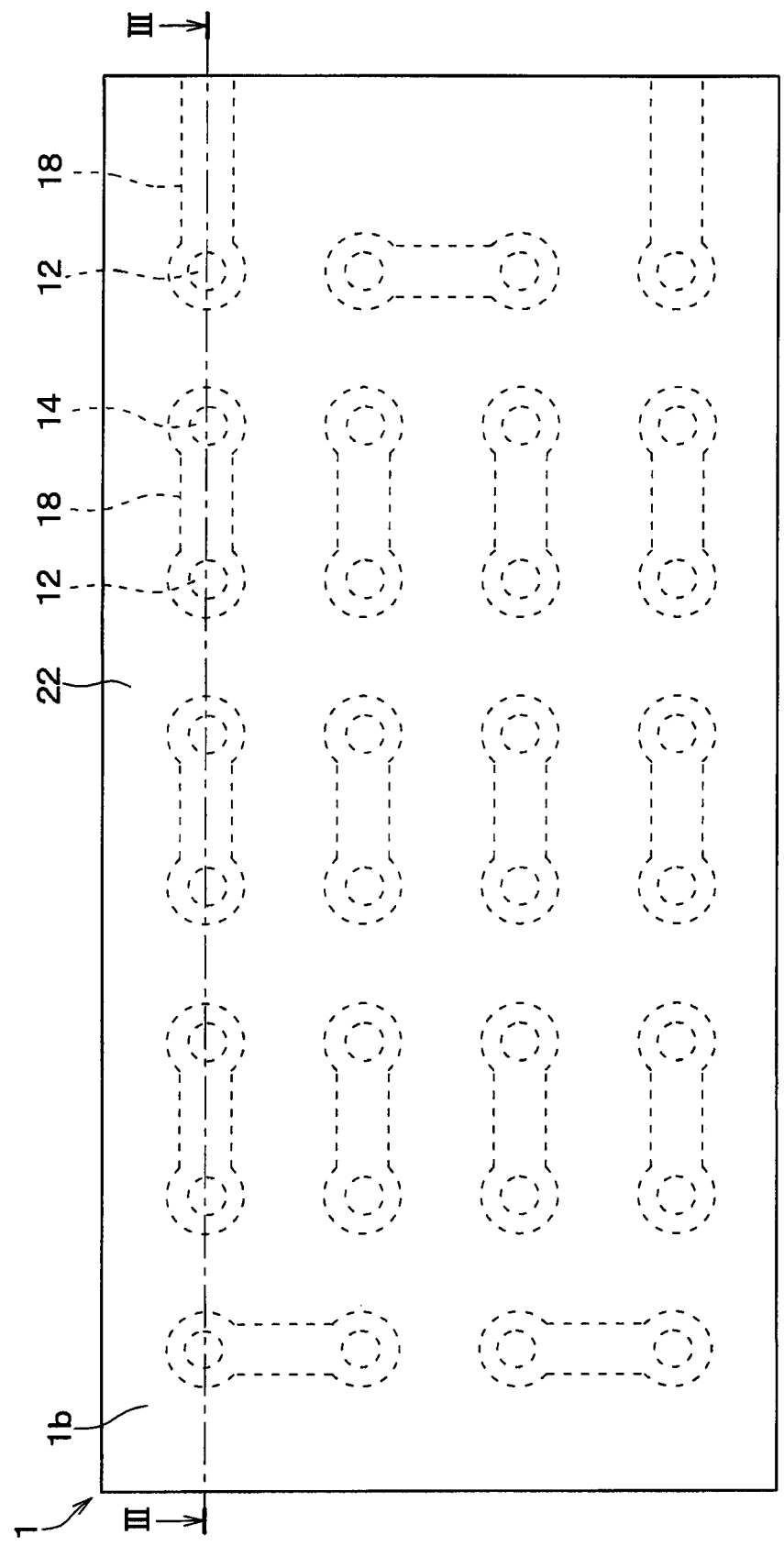
FIG. 2 is a bottom view of the heat flux sensor shown in FIG. 1.
Figure 3:
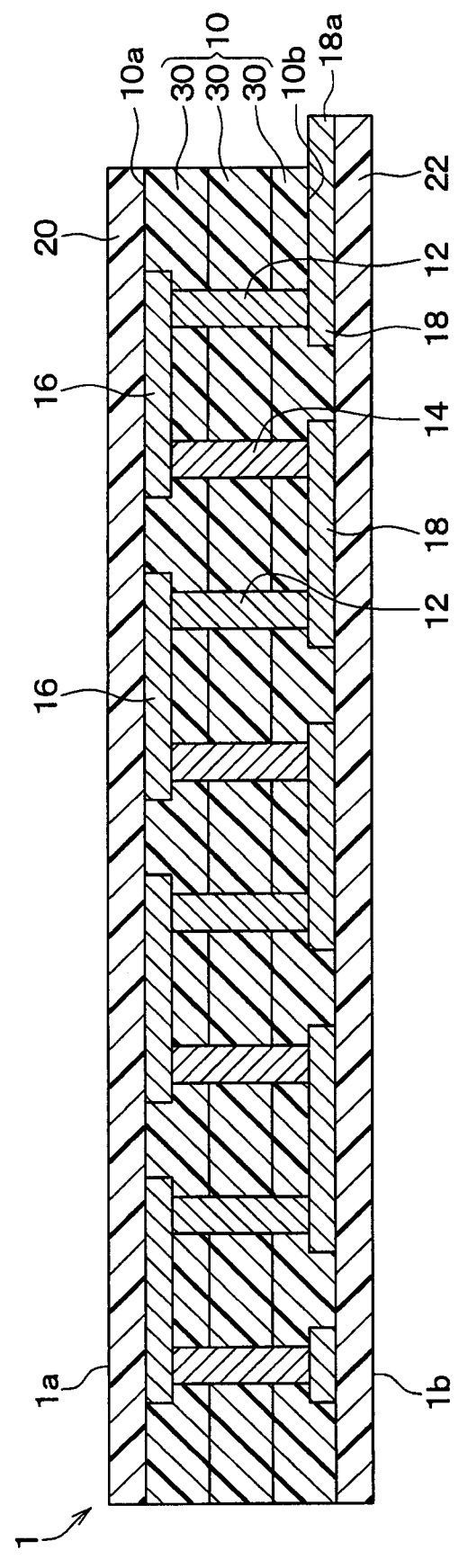
FIG. 3 is a sectional view taken along a line III-III in FIGS. 1 and 2.

As in FIGS. 1 to 3, a heat flux sensor 1 is planar and has a top surface 1a and a back surface 1b. The top surface 1a is one surface of the heat flux sensor 1. The back surface 1b is the other surface opposite the one surface of the heat flux sensor 1.

As in FIG. 3, the heat flux sensor 1 includes an insulating member 10, a plurality of first thermoelectric members 12, a plurality of second thermoelectric members 14, a plurality of top-surface conductor patterns 16, a plurality of back-surface conductor patterns 18, a top-surface protection member 20, and a back-surface protection member 22.

The insulating member 10 is planar to have a top surface 10a and a back surface 10b. The insulating member 10 is formed of an insulating material. The insulating member 10 is formed of an integrated stacked body having a plurality of resin films 30. The resin films 30 are formed of thermoplastic resin. The insulating member 10 is flexible.

The plurality of first thermoelectric members 12 and the plurality of second thermoelectric members 14 are formed of thermoelectric material to convert heat energy and electrical energy to each other. The first thermoelectric members 12 is formed of a different thermoelectric material from the second thermoelectric members 14. The first thermoelectric members 12 are formed of a P type thermoelectric material. The second thermoelectric members 14 are formed of an N type thermoelectric material.

The plurality of first thermoelectric members 12 and the plurality of second thermoelectric members 14 are each shaped to extend in the thickness direction of the insulating member 10. Each first thermoelectric member 12 and each second thermoelectric member 14 are spaced from each other and disposed adjacent each other. Each first thermoelectric member 12 and each second thermoelectric member 14 are alternately electrically connected in series.

The plurality of top-surface conductor patterns 16 are disposed at the top surface 10a of the insulating member 10. Each surface conductor pattern 16 electrically connects the adjacent first thermoelectric member 12 and second thermoelectric member 14 to each other as in FIGS. 1 and 3.

The plurality of back-surface conductor patterns 18 are disposed at the back surface 10b of the insulating member 10. Each back-surface conductor pattern 18 connects the adjacent first thermoelectric member 12 and second thermoelectric member 14 to each other as in FIGS. 2 and 3. Specifically, each back-surface conductor pattern 18 connects, to each other, the first thermoelectric member 12 and second thermoelectric member 14 respectively connected to the adjacent top-surface conductor patterns 16.

The plurality of top-surface conductor patterns 16 and the plurality of back-surface conductor patterns 18 are formed of conductive material such as metallic material.

The top-surface protection member 20 is disposed adjacent to the top surface 10a of the insulating member 10. The top-surface protection member 20 covers the plurality of top-surface conductor patterns 16 and the top surface 10a of the insulating member 10. The back-surface protection member 22 is disposed adjacent to the back-surface 10b of the insulating member 10. The back-surface protection member 22 covers the plurality of back-surface conductor patterns 18 and the back surface 10b of the insulating member 10.

The top-surface protection member 20 and back-surface protection member 22 are planar. The top-surface protection member 20 and back-surface protection member 22 are formed of thermoplastic resin as insulating material. The top-surface protection member 20 and back-surface protection member 22 have flexibility.

According to the present embodiment, parts 18a, 18b of the back-surface conductor patterns 18 are exposed as in FIGS. 1 and 3. The parts 18a, 18b of the back-surface conductor patterns 18 form connection terminals for external electric connection.

Heat passes through the interior of the heat flux sensor 1 from one of the top surface 1a and back surface 1b to the other. At this time, a difference in temperature occurs between the top surface 1a and back surface 1b. A difference in temperature thus occurs between the top-surface conductor patterns 16 and back-surface conductor patterns 18. In response to the difference in temperature, thermoelectric power is generated in the first and second thermoelectric members 12 and 14 by the Seebeck effect. The heat flux sensor 1 outputs this thermoelectric power such as voltage as a sensor signal.

A method of manufacturing the heat flux sensor 1 of the present embodiment is explained below.

Figure 4:
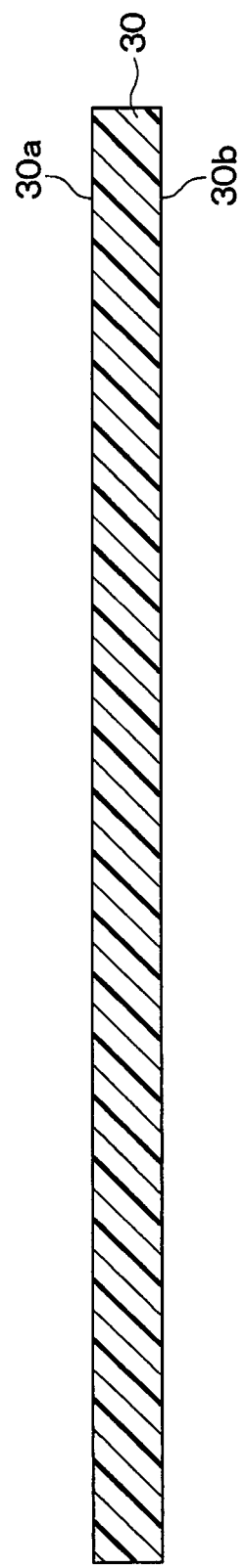
FIG. 4 is a sectional view illustrating a manufacturing process of the heat flux sensor according to the first embodiment.

First, as in FIG. 4, the plurality of resin films 30 are prepared. FIG. 4 illustrates one resin film 30. The resin film 30 has a top surface 30a and a back surface 30b. The top surface 30a corresponds to a first surface that is one surface of the insulating film. The back surface 30b corresponds to a second surface that is the other surface of the insulating film opposite the one surface.

Figure 5:
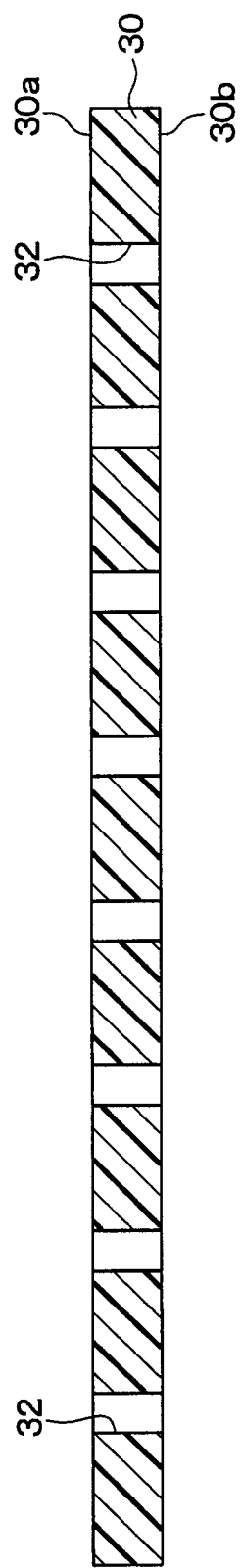
FIG. 5 is a sectional view illustrating a manufacturing process of the heat flux sensor after FIG. 4.

As in FIG. 5, a plurality of through-holes 32 are formed in the resin film 30. The plurality of through-holes 32 are formed by a drill. As in FIG. 1, the opening shapes of the through-holes 32 are circular. Thus, the plurality of resin films 30 each having the plurality of through-holes 32 are prepared.

Figure 6:
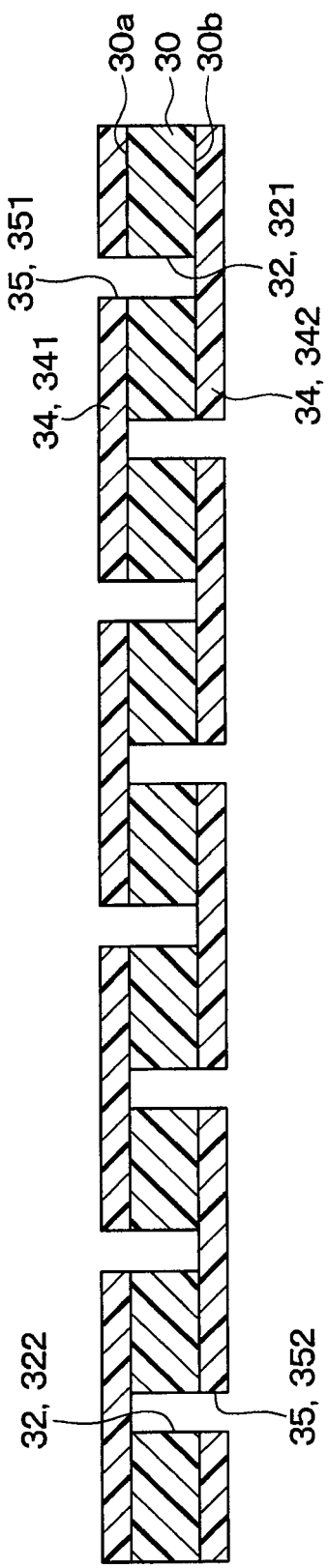
FIG. 6 is a sectional view illustrating a manufacturing process of the heat flux sensor after FIG. 5.

As in FIG. 6, a mask 34 is disposed to the resin film 30. The mask 34 is made of resin. The mask 34 may use a sheet metal. The mask 34 has a plurality of openings 35 respectively corresponding to the plurality of through-holes 32. The mask 34 is used to fill the plurality of through-holes 32 with fillers.

According to the present embodiment, a first mask 341 as the mask 34 is disposed to the top surface 30a of the resin film 30. The first mask 341 is used for the filling with fillers to form the first thermoelectric members 12. A second mask 342 as the mask 34 is disposed to the back surface 30b of the resin film 30. The second mask 342 is used for the filling with fillers to form the second thermoelectric members 14.

Specifically, the first mask 341 has first openings 351 corresponding to first through-holes 321 of the plurality of through-holes 32. The first mask 341 covers the surface 30a of the resin film 30 except the first through-holes 321.

The second mask 342 has second openings 352 corresponding to second through-holes 322 of the plurality of through-holes 32. The second mask 342 covers the back-surface 30b of the resin film 30 except the second through-holes 322. The second mask 342 on the back surface 30b is on the bottoms of the first through-holes 321. The first through-holes 321 are opened toward the top surface 30a. The first mask 341 on the top surface 30a is on the bottoms of the second through-holes 322. The second through-holes 322 are opened toward the back surface 30b.

Figure 7:
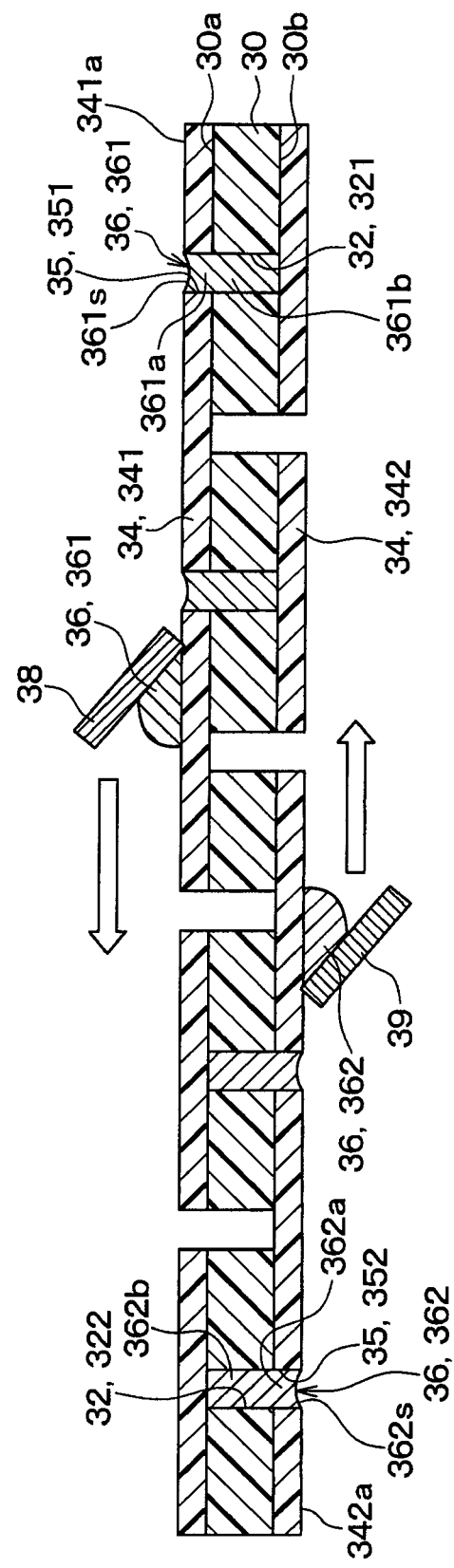
FIG. 7 is a sectional view illustrating a manufacturing process of the heat flux sensor after FIG. 6.

As in FIG. 7, each of the plurality of through-holes 32 is selectively filled with a filler 36 by using the mask 34. The filler 36 has a plurality of thermoelectric material particles mixed with solvent into a paste. That is, the filler 36 includes a plurality of thermoelectric material particles in the state of paste. The filler 36 therefore includes a plurality of thermoelectric material particles.

A first filler 361 as the filler 36 is disposed on an outer surface 341a of the first mask 341. Each of the plurality of first through-holes 321 is filled with the first filler 361 by using a squeegee 38. Thermoelectric material particles of the first filler 361 are P type ones. A surface 361s of the first filler 361 is positioned between the top surface 30a of the resin film 30 and the outer surface 341a of the first mask 341 in the thickness direction of the resin film 30 in each of the plurality of first through-holes 321. A part 361a of the first filler 361 is extruded from each first through-hole 321. The other part 361b of the first filler 361 is disposed inside each first through-hole 321.

Similarly, a second filler 362 as the filler 36 is disposed on an outer surface 342a of the second mask 342. Each of the plurality of second through-holes 322 is filled with the second filler 362 by using a squeegee 39. Thermoelectric material particles of the second filler 362 are N type ones. A surface 362s of the second filler 362 is positioned between the back surface 30b of the resin film 30 and the outer surface 342a of the second mask 342 in the thickness direction of the resin film 30 in each of the plurality of second through-holes 322. A part 362a of the second filler 362 is extruded from each second through-hole 322. The other part 362b of the second filler 362 is disposed inside each second through-hole 322.

Figure 8:
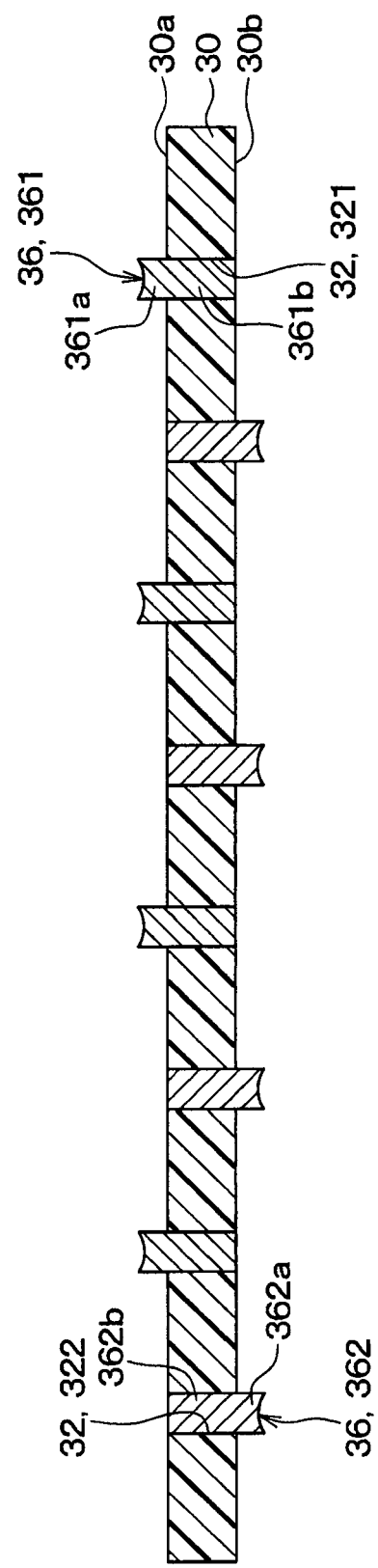
FIG. 8 is a sectional view illustrating a manufacturing process of the heat flux sensor after FIG. 7.

Thus, the plurality of through-holes 32 of each of the plurality of resin films 30 are filled with the fillers 36. Then, the masks 34 are removed as in FIG. 8.

Figure 9:
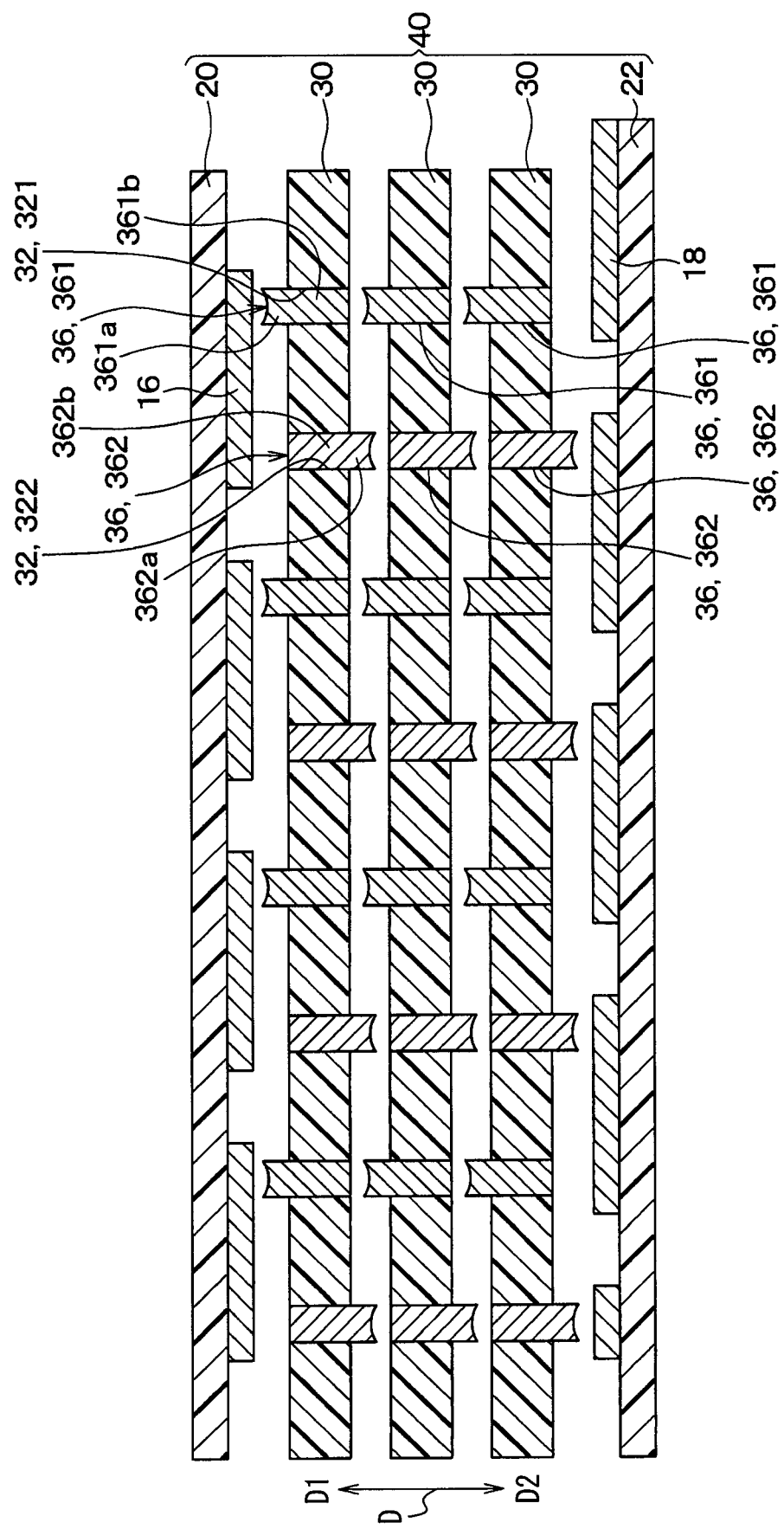
FIG. 9 is a sectional view illustrating a manufacturing process of the heat flux sensor after FIG. 8.

As in FIG. 9, the plurality of resin films 30, top-surface protection member 20, and back-surface protection member 22 are stacked to form an integrated stacked body 40. Arrow D in FIG. 9 indicates the stacking directions of the plurality of resin films 30, top-surface protection member 20, and back-surface protection member 22. Arrow D1 indicates one stacking direction toward the top-surface protection member 20. Arrow D2 indicates the other stacking direction toward the back-surface protection member 22.

In this case, the part 361a of the first filler 361 is extruded from each first through-hole 321, and the part 362a of the second filler 362 is extruded from each second through-hole 322. In this state, the resin films 30 are stacked together. The first fillers 361 of the plurality of resin films 30 are arranged in the stacking direction. The second fillers 362 of the plurality of resin films 30 are arranged in the stacking direction.

Specifically, the parts 361a extruded from the through-holes 32 come into contact with the other parts 361b disposed inside the through-holes 32. The parts 362a extruded from the through-holes 32 come into contact with the other parts 362b disposed inside the through-holes 32. These contacts are made between the fillers 36 arranged in the stacking direction. The part 361a of each first filler 361 in one of the two adjacent resin films 30 in the stacking direction comes into contact with the other part 361b of each first filler 361 of the other resin film 30. The part 362a of each second filler 362 in the one resin film 30 comes into contact with the other part 362b of each second filler 362 in the other resin film 30. The plurality of resin films 30 are thus stacked together.

The three resin films 30 are stacked in FIG. 9, but this is not limiting. The number of the stacked resin films 30 may be any number equal to or more than two.

The top-surface protection member 20 is stacked on one side (toward D1) of a whole of the plurality of resin films 30 in the stacking direction. The top-surface protection member 20 to be stacked has been previously formed with the plurality of top-surface conductor patterns 16 on a surface facing the plurality of resin films 30. Each of the plurality of top-surface conductor patterns 16 comes into contact with the predetermined first filler 361 and second filler 362. The plurality of top-surface conductor patterns 16 are first conductor films patterned with the plurality of top-surface conductor patterns 16.

The back-surface protection member 22 is stacked on the other surface (toward D2) of the whole of the plurality of resin films 30 in the stacking direction. The back-surface protection member 22 to be stacked has been previously formed with the plurality of back-surface conductor patterns 18 on a surface facing the plurality of resin films 30. Each of the plurality of back-surface conductor patterns 18 contacts the predetermined first filler 361 and second filler 362. The plurality of back-surface conductor patterns 18 are second conductor films patterned with the plurality of back-surface conductor patterns 18.

Figure 10:
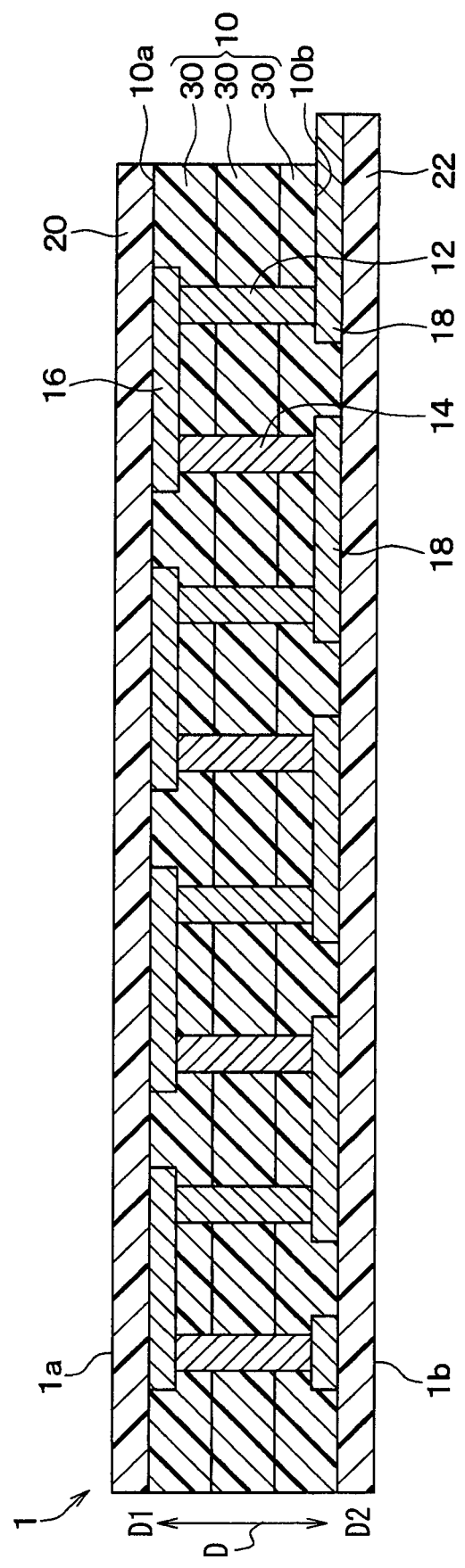
FIG. 10 is a sectional view illustrating a manufacturing process of the heat flux sensor after FIG. 9.

As in FIG. 10, the integrated stacked body 40 is heated and pressurized in the stacking direction. The plurality of resin films 30, top-surface protection member 20, and back-surface protection member 22 are thus integrated with each other.

Further, the plurality of P type thermoelectric material particles are sintered together to form the first thermoelectric members 12. The formed first thermoelectric members 12 have continuous shapes from the top-surface conductor patterns 16 to the back-surface conductor patterns 18. The first thermoelectric members 12 are connected to both the top-surface conductor patterns 16 and back-surface conductor patterns 18.

Similarly, the plurality of N type thermoelectric material particles are sintered together to form the second thermoelectric members 14. The formed second thermoelectric members 14 have continuous shapes from the surface conductor patterns 16 to the back-surface conductor patterns 18. The second thermoelectric members 14 are connected to both the top-surface conductor patterns 16 and back-surface conductor patterns 18.

In the present embodiment, the interior of a heating and pressurizing apparatus is vacuumed to a low vacuum state before and during heating and pressurizing. The solvent in the fillers 36 is removed in the low vacuum state inside the heating and pressurizing apparatus.

The heat flux sensor 1 having the structure in FIGS. 1 to 3 is thus manufactured.

A method of manufacturing a heat flux sensor 1 of a comparative example 1 is explained using FIGS. 11 to 14. The comparative example 1 is different from the first embodiment in that the insulating member 10 in FIG. 3 is formed using a single resin film.

Figure 11:
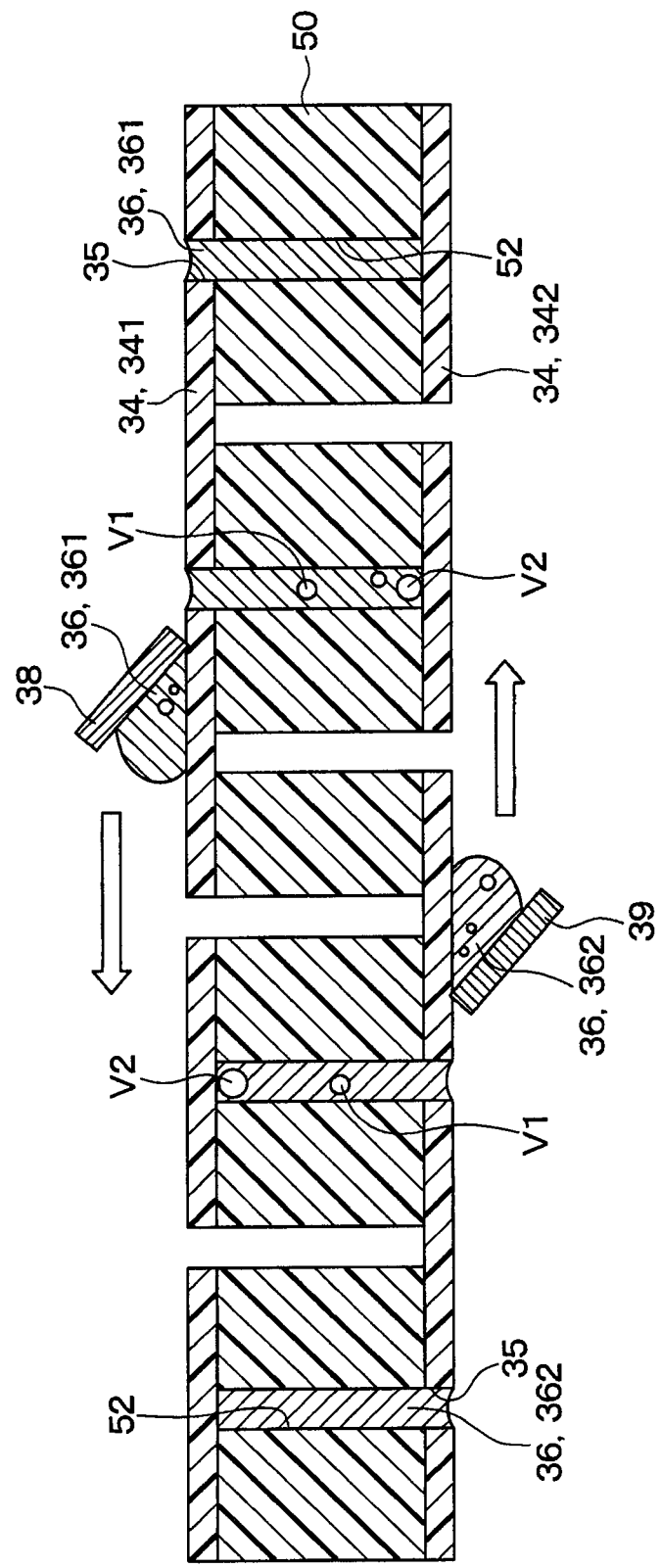
FIG. 11 is a sectional view illustrating a manufacturing process of the heat flux sensor in a comparative example 1.

As in FIG. 11, the comparative example 1 prepares one resin film 50 formed with a plurality of through-holes 52. The thickness of the resin film 50 of FIG. 11 is equivalent to the total thickness of the plurality of resin films 30 of FIG. 9. The opening width of each through-hole 52 is the same as the opening width of each through-hole 32 of FIG. 9. The depth of each through-hole 52 is deeper than that of each through-hole 32 of FIG. 9.

Then, each of the plurality of through-holes 52 is selectively filled with the filler 36 by using the masks 34 as in the first embodiment.

Figure 12:
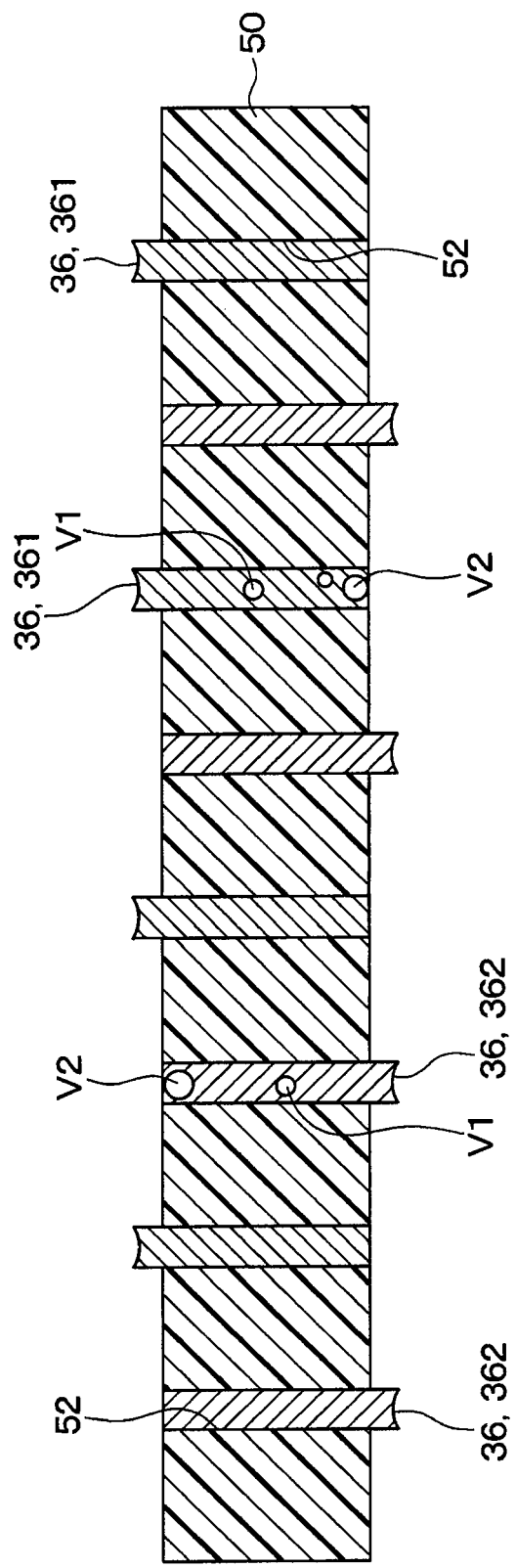
FIG. 12 is a sectional view illustrating a manufacturing process of the heat flux sensor after FIG. 11.

Then, the masks 34 are removed as in FIG. 12.

Figure 13:
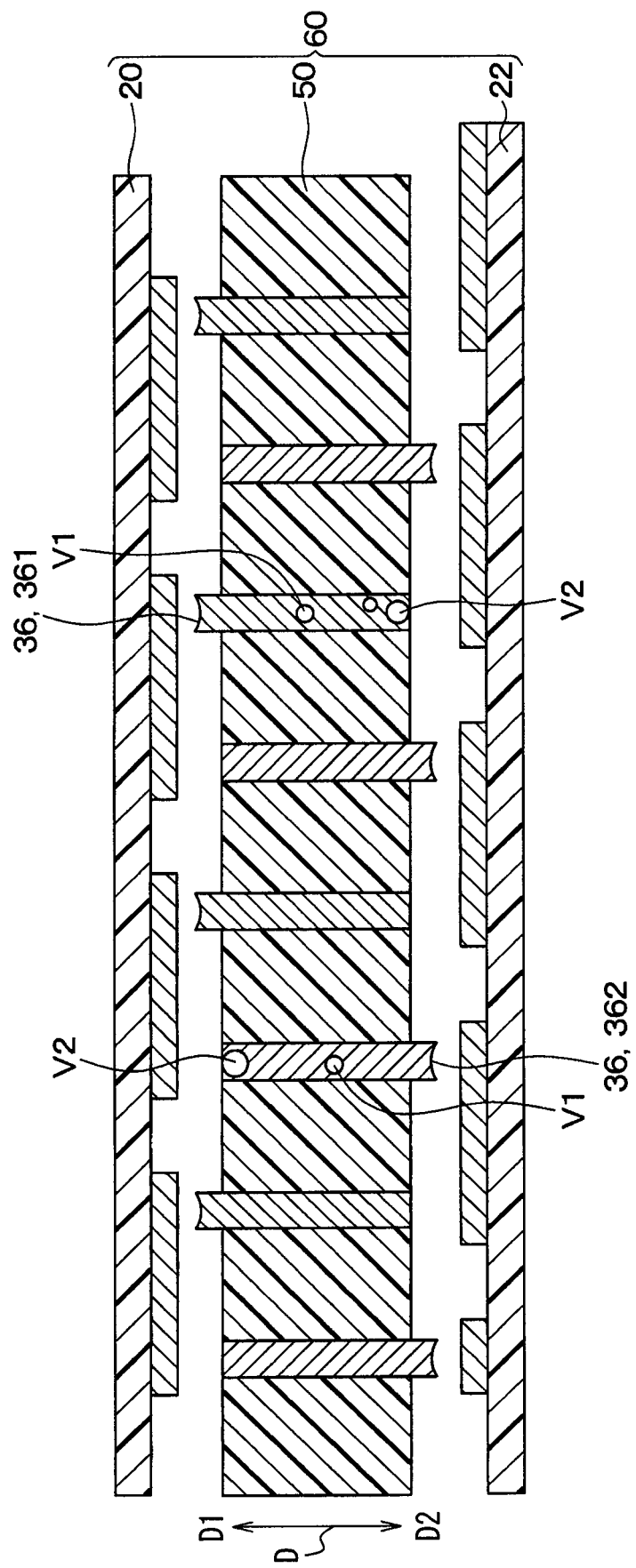
FIG. 13 is a sectional view illustrating a manufacturing process of the heat flux sensor after FIG. 12.

Then, as in FIG. 13, the single resin film 50, top-surface protection member 20, and back-surface protection member 22 are stacked to form an integrated stacked body 60.

Figure 14:
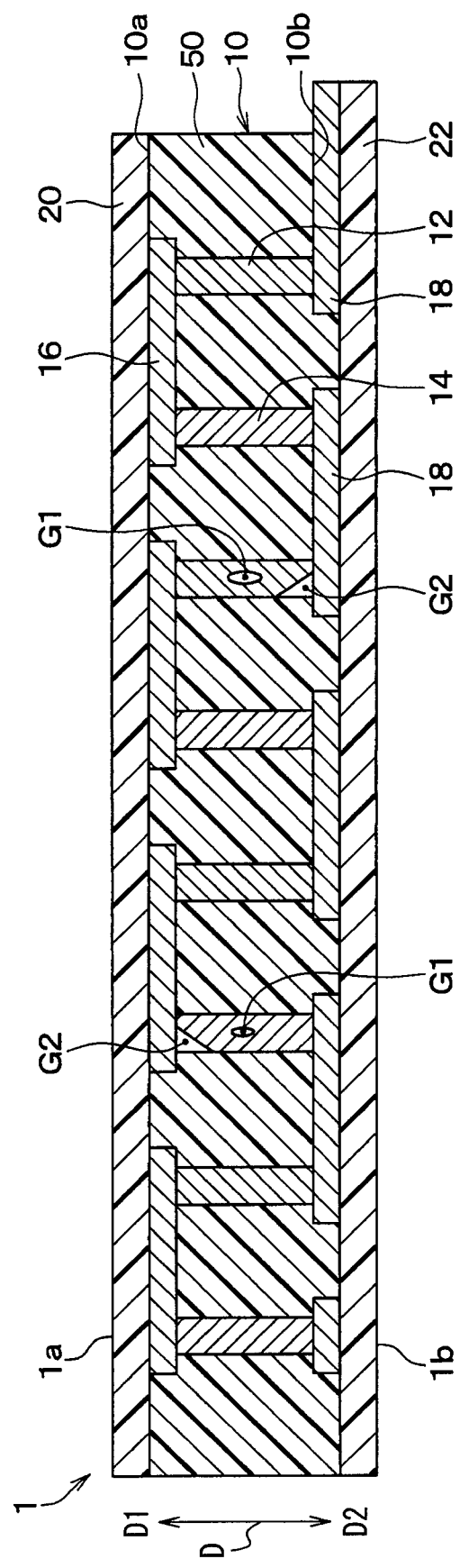
FIG. 14 is a sectional view illustrating a manufacturing process of the heat flux sensor after FIG. 13.

As in FIG. 14, the integrated stacked body 60 is heated and pressurized in the stacking direction. The heat flux sensor 1 having the structure in FIG. 3 is thus manufactured.

As above, the resin film 50 of the comparative example 1 is thicker than the resin film 30 of the first embodiment. Each through-hole 52 of the comparative example 1 has a higher aspect ratio than that of each through-hole 32 of the first embodiment. As in FIG. 11, a larger amount of voids V1 and V2 mix in the fillers 36 that fill the through-holes 52 in the comparative example 1 as compared with the first embodiment. The voids V2 are likely to be present toward the bottoms of the through-holes 52.

The mixing of the voids V1 and V2 causes shortage of the filling amount of the fillers 36 by the volume of the voids V1 and V2. When the voids V1 and V2 mix into the fillers 36 and then the integrated stacked body 60 is heated and pressurized, the fillers 36 are not sufficiently pressurized. The sintering of the thermoelectric material particles is thus insufficient. AS a result, as in FIG. 14, gaps G1 are produced inside the first and second thermoelectric members 12 and 14. Gaps G2 are produced between the first and second thermoelectric members 12 and 14 and the conductor patterns 16 and 18. That is, the contact areas between the first and second thermoelectric members 12, 14 and the conductor patterns 16, 18 are made small. This reduces the connection reliability between the top-surface conductor patterns 16 and back-surface conductor patterns 18.

In contrast, in the present embodiment, the insulating member 10 is formed using the plurality of resin films 30. Each of the resin films 30 can be made thinner compared with the comparative example 1 in which the insulating member 10 having the same thickness as the present embodiment is formed using the single resin film 50. The aspect ratio of each through-hole 32 of each resin film 30 can be made small. Compared to the comparative example 1, the voids V1 and V2 mixing into the fillers 36 can be reduced.

According to the present embodiment, the plurality of resin films 30 are stacked together in the state where the parts 361a, 362a of the fillers 36 are extruded from the through-holes 32. The fillers 36 can be heated and pressurized in the state where the filling amount of the fillers 36 is greater than the internal volume of the through-holes 32.

A part of the filler 36 is extruded from each through-hole 32 also in the comparative example 1. However, the comparative example 1 uses only one resin film 50 from which the parts of the fillers 36 are extruded. The present embodiment uses the plurality of resin films 30 from which the parts of the fillers 36 are extruded. The present embodiment can use a larger amount of the fillers 36 than the comparative example 1.

Shortage of the fillers 36 can be thus avoided when voids mix into the fillers 36 filling the through-holes 32. The fillers 36 can be sufficiently pressurized when the integrated stacked body 40 is heated and pressurized. Therefore, a plurality of P type and N type thermoelectric material particles can be sufficiently sintered. This prevents the gaps G1 from generating inside the first and second thermoelectric members 12 and 14 and the gaps G2 from generating between the first and second thermoelectric members 12 and 14 and the conductor patterns 16 and 18. Also when no void mixes into the fillers 36 filling the through-holes 32, the gaps G2 are restricted from generating between the first and second thermoelectric members 12 and 14 and the conductor patterns 16 and 18.

This can improve the connection reliability between the top-surface conductor patterns 16 and back-surface conductor patterns 18.

The above point is obtained also when the thermoelectric converter is used for the applications other than heat flux sensors. However, the above point becomes remarkable when the thermoelectric converter is used as the heat flux sensor 1. It is because, as the insulating member 10 is thicker, the distance between one surface in contact with measured targets and the other opposite surface is made longer in the heat flux sensor 1, and thus the difference in temperature between the one surface and other surface increases. This improves the sensitivity of the heat flux sensor 1.

The insulating member 10 is formed using the plurality of resin films 30 in the present embodiment. Any number of the stacked resin films 30 is set to obtain a desired thickness of the insulating member 10.

When the area, material, and structure of the heat flux sensor 1 are unchanged, the sensitivity and flexibility of the heat flux sensor 1 are inversely proportional to each other. When the number of the stacked resin films 30 increases, the distance between one surface contacting measured targets and the other opposite surface increases in the heat flux sensor 1. The difference in temperature between the one surface and other opposite surface increases. This improves the sensitivity of the heat flux sensor 1. However, an increase in the number of the stacked resin films 30 reduces the flexibility.

In other words, the heat flux sensor 1 becomes thinner and more flexible as the number of the stacked resin films 30 becomes smaller. However, the sensitivity of the heat flux sensor 1 becomes lower as the number of the stacked resin films 30 becomes smaller.

The number of the stacked resin films 30 becomes larger as the heat flux sensor 1 becomes thicker. This causes an increase in cost because the amount of the material to be used becomes larger. The resin film 30 may use thin material having creases to decrease the yield. In this case, the larger number of the resin films 30 causes an increase in cost.

Therefore, the insulating member 10 having a desired thickness can be obtained by regulating the stacking number based on requirement about the sensitivity and flexibility of the heat flux sensor 1.

Other Embodiments (1) In the first embodiment, the parts 361*a*, 362*a* extruded from the through-holes 32 respectively come into contact with the other parts 361*b*, 362*b* disposed inside the through-holes 32. These contacts are made between the fillers 36 arranged in the stacking direction to form the integrated stacked body. The plurality of resin films 30 are stacked together to be this state, but this is not limiting. The plurality of resin films 30 may be stacked together to come into contact with the parts 361*a*, 362*a* of the fillers 36 to each other. The parts 361*a*, 362*a* are extruded from the through-holes 32. Also in this case, the fillers 36 are heated and pressurized to form the thermoelectric members 12 and 14 in FIG. 3.

(2) In the first embodiment, to form the integrated stacked body, the plurality of resin films 30, top-surface protection member 20 having the plurality of top-surface conductor patterns 16, and back-surface protection member 22 having the plurality of back-surface conductor patterns 18 are stacked. This is not limiting. The plurality of resin films 30, the first conductor films before patterned with the top-surface conductor patterns 16, and the second conductor films before patterned with the back-surface conductor patterns 18 may be stacked. In this case, after forming the integrated stacked body, the first conductor films are etched. The first conductor films are thus patterned to form the plurality of top-surface conductor patterns 16. The second conductor films also are etched. The second conductor films are thus patterned to form the plurality of back-surface conductor patterns 18. Then, the top-surface protection member 20 and back-surface protection member 22 are stacked on the integrated stacked body. Also through such a procedure, the heat flux sensor 1 having the structure of FIGS. 1 to 3 can be manufactured.

(3) The first embodiment uses the resin films 30 formed of thermoplastic resin as insulating films. This is not limiting. The insulating films may use resin films formed of resin material other than thermoplastic resin. The insulating films may use resin films formed of insulating material other than resin material, such as ceramic.

(4) The first embodiment uses the through-holes 32 each having a circular opening. This is not limiting. The opening shape of each through-hole 32 may use a different shape such as a polygon.

(5) The first embodiment applies the thermoelectric-converter manufacturing method of the present disclosure to the method of manufacturing the heat flux sensor. This is not limiting. The thermoelectric-converter manufacturing method of the present disclosure is applicable to a method of manufacturing a thermoelectric converter that converts thermal energy to electrical energy, other than the heat flux sensor. The thermoelectric converter manufacturing method of the present disclosure is applicable to a method of manufacturing a thermoelectric converter that converts electrical energy to thermal energy.

The present disclosure is not limited to the above embodiments, can be suitably changed within the scope of the present disclosure, and also includes various modifications and deformations within the range of equivalency. The above embodiments relate to each other. Appropriate combinations of the embodiments are possible unless clearly not possible. In each above embodiment, the components forming each above embodiment are not always required unless explicitly stated as essential and clearly considered essential in principle. In each above embodiment, when numerals such as the number, value, amount, and range of the components of the embodiments are described, the numerals are not limiting unless explicitly stated as essential and clearly limited to specific numerals in principle. In each above embodiment, when materials, shapes, or positional relationship of the components are described, the materials, shapes, or positional relationship are not limiting unless explicitly stated and limited to specific materials, shapes, or positional relationship in principle.

According to the first aspect indicated by part or all of the above embodiments, the thermoelectric-converter manufacturing method includes preparing the plurality of insulating films, filling each of the plurality of through-holes with the fillers, forming the integrated stacked body, and heating and pressurizing the integrated stacked body. In the filling of each of the plurality of through-holes, the part of the filler is extruded from the through-hole and the other part is disposed inside the through-hole. In the forming of the integrated stacked body, the plurality of insulating films are stacked together in the state in which the part of each filler is extruded.

According to the second aspect, in the filling, the first mask that covers the one surface (the first surface) of the insulating film is disposed to the one surface, and the second mask that covers the other surface (the second surface) of the insulating film is disposed to the other surface. The first mask has the first openings corresponding to the first through-holes of the plurality of through-holes. The second mask has the second openings corresponding to the second through-holes of the plurality of through-holes. With the second mask closing the first through-holes, the first through-holes are filled with the first fillers as the fillers from the first openings of the first mask. The top surface of each first filler is positioned between the one surface of the insulating film and the outer surface of the first mask in the thickness direction. Thus, the part of the first filler is extruded from each first through-hole and the other part of the first filler is disposed inside each first through-hole. With the first mask closing the second through-holes, the second through-holes are filled with the second fillers as the fillers from the second openings of the second mask. The top surface of each second filler is positioned between the other surface of the insulating film and the outer surface of the second mask in the thickness direction. Thus, the part of the second filler is extruded from each second through-hole and the other part of the second filler is disposed inside each second through-hole. Specifically, such filling is achieved in the first aspect.

What is claimed is:

1. A method of manufacturing a thermoelectric converter, comprising:
    preparing a plurality of insulating films each having a plurality of first through-holes and a plurality of second through-holes;
    filling the plurality of first through-holes with a first filler and filling the plurality of second through-holes with a second filler for each of the plurality of insulating films, the first filler containing first thermoelectric material particles and the second filler containing second thermoelectric material particles;
    forming an integrated stacked body by stacking the plurality of insulating films together after the filling of the plurality of first through-holes and the filling of the plurality of second through-holes by stacking first conductor films on one side of a whole of the plurality of insulating films in a stacking direction and stacking second conductor films on the other side of the whole of the plurality of insulating films in the stacking direction; and
    forming first thermoelectric members from the first filler and forming second thermoelectric members from the second filler, the first thermoelectric members and the second thermoelectric members having continuous shapes from the first conductor films to the second conductor films, by heating and pressurizing the integrated stacked body in a stacking direction of the integrated stacked body and by sintering the first thermoelectric material particles of the first filler and the second thermoelectric material particles of the second filler, and connecting the first thermoelectric members and the second thermoelectric members to both the first conductor films and the second conductor films, wherein
    the filling of the plurality of first through-holes and the filling of the plurality of second through-holes includes placing a first mask on a first surface of each of the plurality of insulating films and a second mask on a second surface of each of the plurality of insulating films, the second surface being opposite to the first surface,
    the first mask has first openings corresponding to the plurality of first through-holes and covers the plurality of second through-holes,
    the second mask has second openings corresponding to the plurality of second through-holes and covers the plurality of first through-holes,
    the filling of the plurality of first through-holes includes filling the plurality of first through-holes with the first filler through the first openings of the first mask in a state where the second mask covers the plurality of first through-holes on the second surface of each of the plurality of insulating films such that a portion of the first filler extrudes from each of the plurality of first through-holes and a surface of the first filler is positioned between the first surface of the insulating film and an outer surface of the first mask in a thickness direction of the insulating film, and another portion of the first filler is disposed in each of the plurality of first through-holes,
    the filling of the plurality of second through-holes includes filling the plurality of second through-holes with the second filler through the second openings of the second mask in a state where the first mask covers the plurality of second through-holes on the first surface of each of the plurality of insulating films such that a portion of the second filler extrudes from each of the plurality of second through-holes and a surface of the second filler is positioned between the second surface of the insulating film and an outer surface of the second mask in the thickness direction of the insulating film, and another portion of the second filler is disposed in each of the plurality of second through-holes, and
    the forming of the integrated stacked body includes stacking the plurality of insulating films together in a state where the portion of the first filler extrudes from each of the plurality of the first through-holes and the portion of the second filler extrudes from each of the plurality of the second through-holes.

2. The method of claim 1, wherein the first thermoelectric material particles of the first filler are p-type particles and the second thermoelectric material particles of the second filler are n-type particles.

* * * * *